United States Patent
Zhu et al.

(10) Patent No.: US 7,447,945 B2
(45) Date of Patent: Nov. 4, 2008

(54) SYSTEM AND METHOD FOR TESTING A SERIAL PORT

(75) Inventors: Guang-Yu Zhu, Guangdong (CN); San-Yi Shu, Guangdong (CN)

(73) Assignees: Hong Fu Jin Precision Industry (Shen Zhen) Co., Ltd., Longhua Town, Bao'an District, Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 329 days.

(21) Appl. No.: 11/309,162

(22) Filed: Jul. 3, 2006

(65) Prior Publication Data
US 2007/0113125 A1 May 17, 2007

(30) Foreign Application Priority Data
Nov. 11, 2005 (CN) .................. 2005 1 0101238

(51) Int. Cl.
*G06F 11/00* (2006.01)
(52) U.S. Cl. ........................................... 714/43
(58) Field of Classification Search .................. 714/43
See application file for complete search history.

(56) References Cited

U.S. PATENT DOCUMENTS

| | | | |
|---|---|---|---|
| 5,983,379 A | 11/1999 | Warren | |
| 2002/0087924 A1* | 7/2002 | Panis et al. | 714/712 |
| 2003/0196139 A1* | 10/2003 | Evans | 714/25 |
| 2004/0102916 A1* | 5/2004 | Chen et al. | 702/117 |
| 2004/0102917 A1* | 5/2004 | Chen et al. | 702/120 |
| 2007/0013125 A1* | 1/2007 | Murai | 271/207 |
| 2007/0113125 A1* | 5/2007 | Zhu et al. | 714/724 |
| 2007/0113133 A1* | 5/2007 | Liu et al. | 714/736 |

* cited by examiner

*Primary Examiner*—Emerson C Puente
(74) *Attorney, Agent, or Firm*—Winston Hsu

(57) ABSTRACT

An exemplary system for testing a serial port includes a serial port (106), a female cable connector (108) connected to the serial port, and an optical-coupled chip (110) connected to the female cable connector. The serial port, the female cable connector and the optical-coupled chip collectively form a circular loop. The system further includes a transmitting module (124), a receiving module (126) and a determining module (128). The transmitting module is configured for transmitting data into the circular loop. The receiving module is configured for receiving data from the circular loop. The determining module is configured for comparing the transmitted data and the received data, and determining whether the serial port is in predetermined working condition according to the comparison result. A related method is also provided.

18 Claims, 4 Drawing Sheets

SYSTEM AND METHOD FOR TESTING A SERIAL PORT

FIELD OF THE INVENTION

The present invention is generally related to systems and methods of computer tests, and more particularly, to a system and method for computer hardware devices tests.

DESCRIPTION OF RELATED ART

A serial port is a port or interface that can be used for serial communication in which only 1 bit is transmitted at a time. Most serial ports on personal computers conform to the RS-232C or RS-422 standards. A serial port can be used for almost any type of device, including modems, mice, handwriting boards, and printers. A serial port can typically be either a male connector or a female cable connector. The serial port can consist of either 25 pins or 9 pins. Whether the serial port is a 9-pin or 25-pin they both can accomplish the same set of tasks. However, nowadays, 9-pin serial ports are more common than 25-pin serial ports.

A computer, during assembly, may be installed with a plurality of peripheral devices including serial ports while it is in the assembly plant. Before the computer is shipped to a customer or a computer retailer, the computer should pass a series of tests to make sure that the computer as well as its peripheral devices is in predetermined working condition.

One of these tests is a serial port test. The purpose of the serial port test is to test functions of the serial ports installed in a computer. Typically, the serial port test is done by utilizing a test device that can support a serial port communication, such as a serial mouse or a serial modem.

However, the above mentioned test practice has many disadvantages. For example, each computer requires one serial device for each test, which makes the test very expensive and time-consuming. Furthermore, such tests only test the RxD pin/receptacle and TxD pin/receptacle, and cannot test other pins/receptacles, such as RTS pin/receptacle, CTS pin/receptacle and so on.

What is needed, therefore, is a method for testing a serial port that can test more pins/receptacles and is less expensive and time-consuming.

SUMMARY OF THE INVENTION

One preferred embodiment provides a system for testing a serial port. The system includes a computer having a motherboard and a serial port test unit. The system further includes a female cable connector connected to the motherboard via a serial port, and an optical-coupled chip connected to the female cable connector. The serial port, the female cable connector and the optical-coupled chip collectively form a circular loop. The serial port test unit includes a transmitting module, a receiving module and a determining module. The transmitting module is configured for transmitting data into the circular loop. The receiving module is configured for receiving data from the circular loop. The determining module is configured for comparing the transmitted data and the received data, and determining whether the serial port is in predetermined working condition according to the comparison result.

Another preferred embodiment provides a method for testing a serial port. The method includes the steps of: providing a computer having a motherboard and a female cable connector connected to the motherboard via a serial port; providing an optical-coupled chip connected to the female cable connector, the optical-coupled chip, the serial port, and the female cable connector and collectively forming a circular loop; transmitting data into the circular loop; receiving data from the circular loop; comparing the transmitted data and the received data; and determining whether the serial port is in predetermined working condition according to the comparison result.

Other systems, methods, features, and advantages will be or become apparent to one skilled in the art upon examination of the following drawings and detailed description.

DETAILED DESCRIPTION OF THE INVENTION

Figure 1:
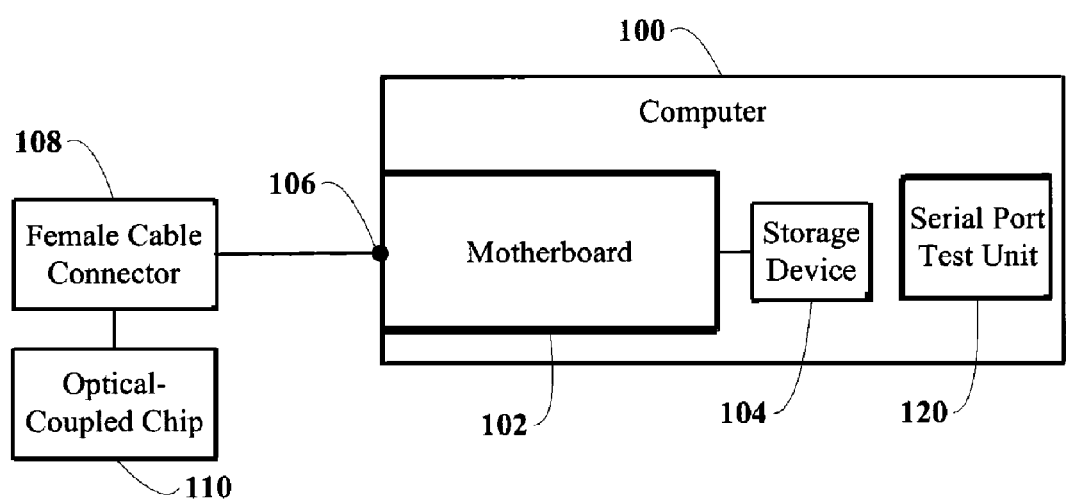
FIG. 1 is a schematic diagram of hardware configuration of a system for testing a serial port in accordance with one preferred embodiment.

FIG. 1 is a schematic diagram of a hardware configuration of a system for testing a serial port in accordance with one preferred embodiment. The system may typically include a computer 100, a female cable connector 108, and an optical-coupled chip 110. The computer 100 may be an IBM clone personal computer (PC). Typically, the computer 100 may include a motherboard 102, a storage device 104, a serial port 106 configured on the motherboard 102, a central processing unit (CPU), a memory, and other units or hardware, such as an audio card, a graphic accelerating card, a keyboard, a mouse, and so on. However, in order to describe the preferred embodiment concisely, these units are not shown in the drawings.

The motherboard 102 may be a typical main board that can be configured in a computer. The motherboard 102 typically provides a plurality of interfaces or ports for attachment of various peripheral devices or hardware, for example, providing a CPU socket for the attachment of a CPU and providing a memory slot for the attachment of a memory. In the preferred embodiment, the motherboard 102 further provides a storage interface for the attachment of the storage device 104, and a serial port 106 for the attachment of the female cable connector 108.

The serial port 106 is a male connector corresponding to the female cable connector 108. In the preferred embodiment, the serial port 106 has nine pins, and the female cable connector 108 has nine receptacles corresponding to the pins. Alternatively, the serial port 106 may consist of twenty-five pins, and the female cable connector 108 has twenty-five receptacles corresponding to the pins.

The serial port 106 is connected to the female cable connector 108 by inserting the pins of the serial port 106 into the receptacles of the female cable connector 108. The female cable connector 108 is further connected to the optical-coupled chip 110. The connection between the female cable connector 108 and the optical-coupled chip 110 is illustrated in more detail in relation to FIG. 2. As a result, the serial port 106, the female cable connector 108 and the optical-coupled chip 110 collectively form a circular loop. Data can be transmitted in the circular loop.

The storage device 104 may be an internal storage of the computer 100, such as a hard disk or a floppy disk, or even an external storage device, such as a compact disk, a flash memory or the like.

Moreover, a serial port test unit 120 is installed on the computer 100 to assist the computer 100 to test whether the serial port 106 is in predetermined working condition. The serial port test unit 120 is typically an application software or a combination thereof executable by a typical computer.

Figure 2:
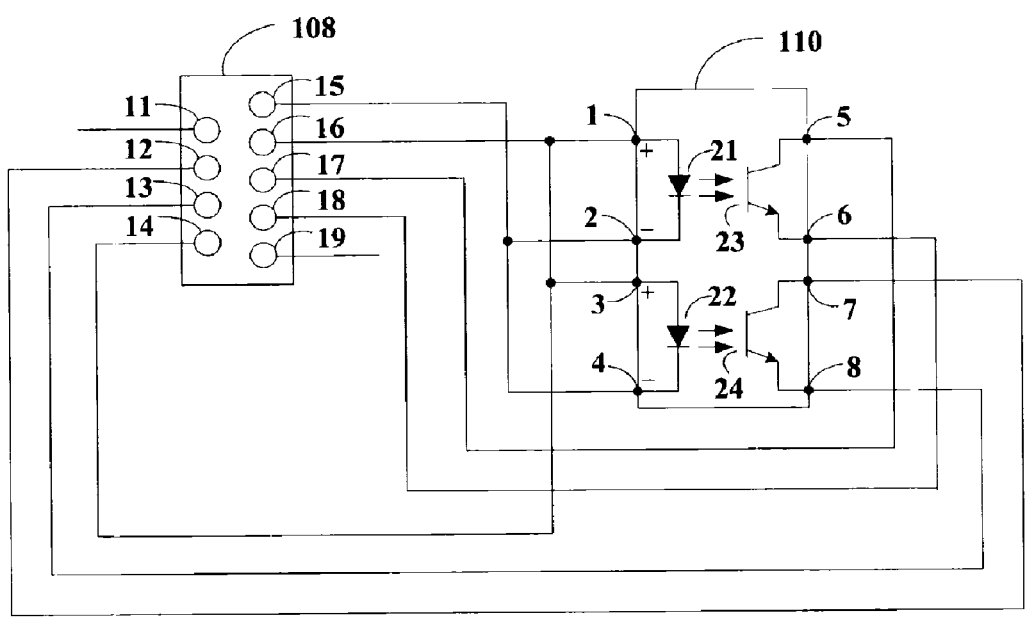
FIG. 2 is a schematic diagram illustrating the detail of the connection between the female cable connector and the optical-coupled chip of FIG. 1.

FIG. 2 is a schematic diagram illustrating the detail of the connection between the female cable connector 108 and the optical-coupled chip 110. The female cable connector 108 has nine receptacles: a ring indicator (RI) receptacle 11, a clear-to-send (CTS) receptacle 12, a request-to-send (RTS) receptacle 13, a data-send-ready (DSR) receptacle 14, a signal-ground (SG) receptacle 15, a data-terminal-ready (DTR) receptacle 16, a transmit-data (TxD) receptacle 17, a receive-data (RxD) receptacle 18, and a data-carrier-detect (DCD) receptacle 19. It is known that the serial port 106, as a male connector corresponding to the female cable connector 108, has nine pins correspondingly: a RI pin, a CTS pin, a RTS pin, a DSR pin, an SG pin, a DTR pin, a TxD pin, a RxD pin, and a DCD pin.

The optical-coupled chip 110 includes eight joints (shown with from joint 1 to joint 8). Specifically, joint 1 and joint 3 are positive poles, joint 2 and joint 4 are negative poles, joint 5 and joint 7 work as transmitters that can transmit data, and joint 6 and joint 8 work as receivers that can receive data from joint 5 and joint 7 respectively.

The optical-coupled chip 110 further includes a light emitting diode (LED) 21 configured between joint 1 and joint 2, a LED 22 configured between joint 3 and joint 4, a light receiver 23 configured between joint 5 and joint 6, and a light receiver 24 configured between joint 7 and joint 8.

CTS receptacle 12, RTS receptacle 13, TxD receptacle 17, and RxD receptacle 18 are connected to joints 7, 8, 5, and 6 respectively. SG receptacle 15 is connected to the negative poles (joints 2 and 4). DSR receptacle 14, DTR receptacle 16, and the positive poles (joints 1 and 3) are connected to one another.

Once the serial port 106 is initialized, the female cable connector 108 and the optical-coupled chip 110 are powered on and activated because of the direct or indirect connection with the serial port 106. Specifically, electricity currents pass through DSR receptacle 14 and DTR receptacle 16, and charges accelerate at joints 1 and 3. When there are enough charges at joints 1 and 3, the LEDs 21 and 22 start emitting lights. The light receivers 23 and 24 receives the lights from the LEDs 21 and 22, and thus make joints 5 and 6 connected and joints 7 and 8 connected. Because the joints 5 and 6 are connected, TxD receptacle 17 and RxD receptacle 18 are connected and form a data transferable path. Furthermore, because joints 7 and 8 are connected, CTS receptacle 12 and RTS receptacle 13 are connected and form a data transferable path. As a result, data transmitted from TxD receptacle 17 can be transmitted through joints 5 and 6 sequentially, and received by RxD receptacle 18, and data transmitted from CTS receptacle 12 can be transmitted through joints 7 and 8 sequentially, and further receivable by RTS receptacle 13.

Figure 3:
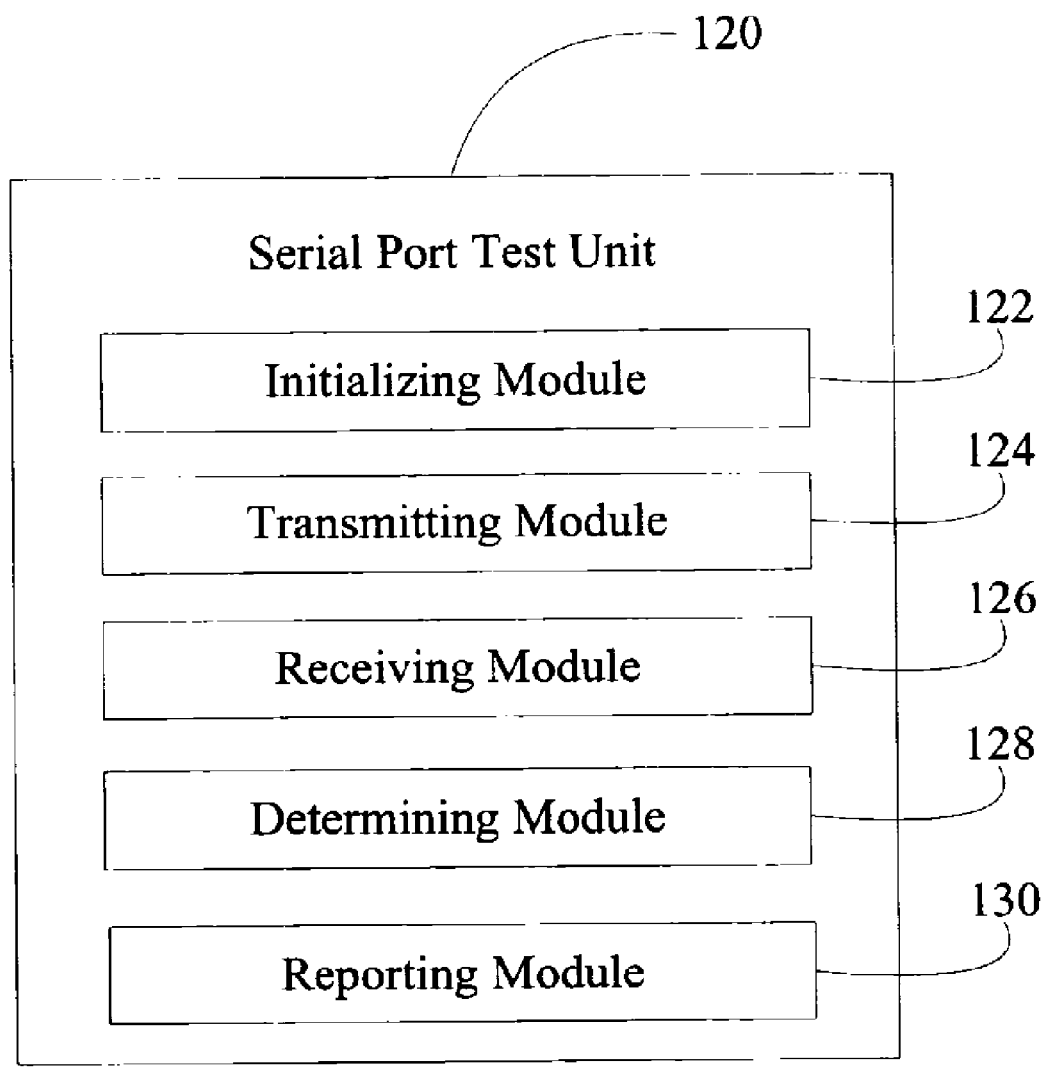
FIG. 3 is a schematic diagram of function modules of the serial port test unit of FIG. 1.

FIG. 3 is a schematic diagram of function modules of the serial port test unit 120. The serial port test unit 120 mainly includes an initializing module 122, a transmitting module 124, a receiving module 126, a determining module 128, and a reporting module 130.

The initializing module 122 is mainly configured for initializing the serial port 106. The serial port 106 may be initialized to have either a flow control or a non-flow control connection between the serial port 106 and the female cable connector 108. Generally, a flow control may be a software flow control, a hardware flow control, an active flow control, a passive flow control, and a combination of the mentioned flow control types. Once the serial port 106 is initialized, the female cable connector 108 and the optical-coupled chip 110 are powered on and activated.

The transmitting module 124 is mainly configured for transmitting data into the circular loop formed by the serial port 106, the female cable connector 108, and the optical-coupled chip 110. The transmitting module 122 generates data of any type in the computer 100 for tests. While under either the flow control or the non-flow control connection, the data are transmitted through the serial port 106 into the circular loop.

The receiving module 126 is mainly configured for receiving data from the circular loop either under the flow control or the non-flow control connection. It should be noted that the test is dedicated to test the serial port 106 with the assistance of the female cable connector 108 and the optical-coupled chip 110. Therefore, normal functionality of the female cable connector 108 and the optical-coupled chip 110 are required and mandatory. If the serial port 106 is in predetermined working condition, the data generated and transmitted by the transmitting module 122 are first transmitted through the serial port 106, then the female cable connector 108, then the optical-coupled chip 110, then back through the female cable connector 108, before finally received by the serial port 106. Otherwise, the data received by the serial port 106 may not be identical with the data generated and transmitted by the transmitting module 122, or even worst, the serial port 106 may not receive any data.

The determining module 128 is mainly configured for comparing the transmitted data and the received data, and for further determining whether the serial port 106 is in predetermined working condition according to a comparison result.

The reporting module 130 is mainly configured for reporting the test result. The test result may be shown on a monitor or printed by a printer, or by any suitable means. Specifically, if the received data and the transmitted data are identical according to the comparison result, the reporting module 130 reports a test result denoting that the serial port 106 is in predetermined working condition; otherwise if the received data and the transmitted data are not identical or the serial port 106 does not receive any data according to the comparison result, the reporting module 130 reports a test result denoting that the serial port 106 is not in predetermined working condition.

Figure 4:
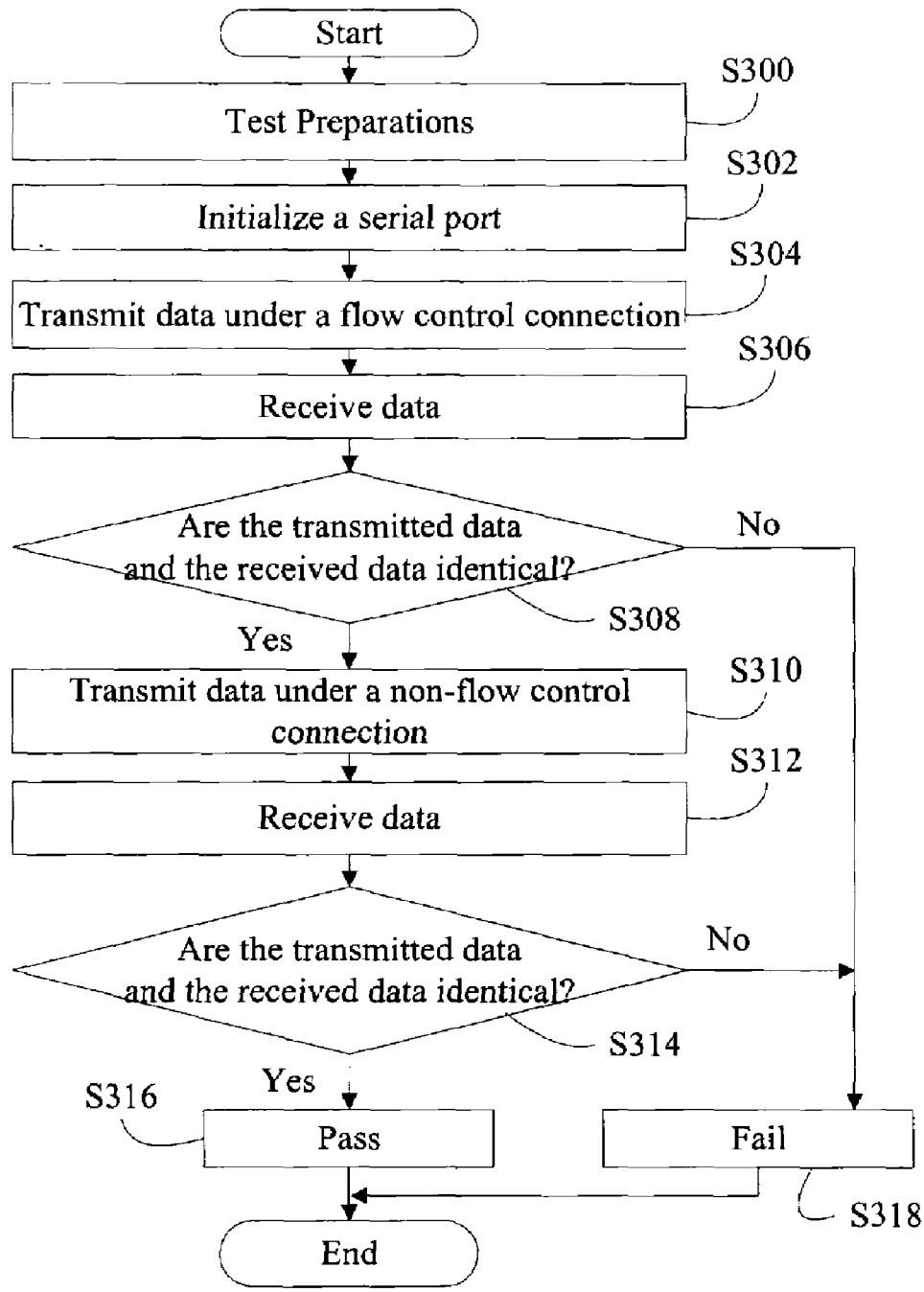
FIG. 4 is a flowchart of a method for testing a serial port in accordance with one preferred embodiment.

FIG. 4 is a flowchart of a method for testing the serial port 106 in accordance with one preferred embodiment. Step S300 includes test preparations that include: connecting the female cable connector 108 to the serial port 106; connecting the female cable connector 108 to the optical-coupled chip 110; and executing the serial port test unit 120 in the computer 100. The detail of the connection between the female cable connector 108 and the optical-coupled chip 110 are described previously in relation to FIG. 2.

In step S302, the initializing module 122 initializes the serial port 106. The serial port 106 may be initialized to have the flow control and/or the non-flow control connection between the serial port 106 and the female cable connector 108.

In step S304, the transmitting module 124 generates data of any type in the computer 100 for testing, and transmits the data under a flow control connection into the circular loop formed by the serial port 106, the female cable connector 108, and the optical-coupled chip 110.

In step S306, the receiving module 126 receives data from the circular loop corresponding the flow control.

In step S308, the determining module 128 compares the transmitted data and the received data for a first time.

If the transmitted data and the received data are identical, in step S310, the transmitting module 124 transmits the data under a non-flow control connection into the circular loop. Then, in step S312, the receiving module 126 receives data from the circular loop corresponding the non-flow control.

In step S314, the determining module 128 compares the transmitted data and the received data for a second time.

If the transmitted data and the received data are identical, in step S316, the serial port 106 passes the test, and the reporting module 130 reports a test result denoting that the serial port 106 is in predetermined working condition. Otherwise if the transmitted data and the received data are not identical, in step S318, the serial port 106 fails for the test, and the reporting module 130 reports a test result denoting that the serial port 106 is not in predetermined working condition. The test result may be shown on a monitor or printed by a printer, or in any other suitable means.

In addition, if in step S308 the transmitted data and the received data are not identical, in step S318, it is determined that the serial port 106 fails for the test, and the reporting module 130 reports a test result denoting that the serial port 106 is not in predetermined working condition.

It should be emphasized that the above-described embodiments of the preferred embodiments, particularly, any "preferred" embodiments, are merely possible examples of implementations, merely set forth for a clear understanding of the principles of the invention. Many variations and modifications may be made to the above-described preferred embodiment(s) without departing substantially from the spirit and principles of the invention. All such modifications and variations are intended to be included herein within the scope of this disclosure and the above-described preferred embodiment(s) and protected by the following claims.

What is claimed is:

1. A system for testing a serial port, the system comprising:
    a computer having a motherboard and a serial port test unit;
    a female cable connector connected to the motherboard via a serial port; and
    an optical-coupled chip connected to the female cable connector, the optical-coupled chip, the serial port, and the female cable connector collectively forming a circular loop; the serial port test unit comprising:
    a transmitting module configured for transmitting data into the circular loop;
    a receiving module configured for receiving data from the circular loop; and
    a determining module configured for comparing the transmitted data and the received data, and determining whether the serial port is in a predetermined working condition according to a comparison result.

2. The system according to claim 1, wherein the serial port test unit further comprises an initializing module configured for initializing the serial port to have a flow control connection between the serial port and the female cable connector.

3. The system according to claim 2, wherein the initializing module is further configured for initializing the serial port to have a non-flow control connection between the serial port and the female cable connector.

4. The system according to claim 1, wherein the serial port test unit further comprises a reporting module configured for reporting a test result denoting whether the serial port is in a predetermined working condition.

5. The system according to claim 1, wherein the serial port has nine pins and the female cable connector has nine receptacles corresponding to the pins.

6. The system according to claim 1, wherein the serial port has twenty-five pins and the female cable connector has twenty-five receptacles corresponding to the pins.

7. The system according to claim 1, wherein the connection between the optical-coupled chip and the female cable connector comprises:
    connection between a RxD receptacle and a TxD receptacle of the female cable connector by the optical-coupled chip;
    connection between a RTS receptacle and a CTS receptacle of the female cable connector by the optical-coupled chip; and
    connection between a DTR receptacle and a DSR receptacle of the female cable connector by the optical-coupled chip.

8. The system according to claim 1, wherein the optical-coupled chip comprises a light emitting diode and a light receiver.

9. The system according to claim 1, wherein the serial port is a male connector corresponding to the female cable connector.

10. A method for testing a serial port, the method comprising the steps of:
    providing a computer having a motherboard and a female cable connector connected to the motherboard via a serial port;
    providing an optical-coupled chip connected to the female cable connector, the optical-coupled chip, the serial port, and the female cable connector, collectively forming a circular loop;
    transmitting data into the circular loop;
    receiving data from the circular loop;
    comparing the transmitted data and the received data; and
    determining whether the serial port is in a predetermined working condition according to the comparison result.

11. The method according to claim 10, further comprising the step of initializing the serial port to have a flow control connection between the serial port and the female cable connector.

12. The method according to claim 10, further comprising the step of initializing the serial port to have a non-flow control connection between the serial port and the female cable connector.

13. The method according to claim 10, further comprising the step of reporting a test result denoting whether the serial port is in predetermined working condition.

14. The method according to claim 10, wherein the serial port has nine pins and the female cable connector has nine receptacles corresponding to the pins.

15. The method according to claim 10, wherein the serial port has twenty-five pins and the female cable connector has twenty-five receptacles corresponding to the pins.

16. The method according to claim 10, wherein the connection between the optical-coupled chip and the female cable connector comprises the steps of:
    connecting a RxD receptacle and a TxD receptacle of the female cable connector by the optical-coupled chip;
    connecting a RTS receptacle and a CTS receptacle of the female cable connector by the optical-coupled chip; and
    connecting a DTR receptacle and a DSR receptacle of the female cable connector by the optical-coupled chip.

17. The method according to claim 10, wherein the optical-coupled chip comprises a light emitting diode and a light receiver.

18. The method according to claim 10, wherein the serial port is a male connector corresponding to the female cable connector.

* * * * *